United States Patent [19]

Doehler et al.

[11] Patent Number: 4,839,714
[45] Date of Patent: Jun. 13, 1989

[54] HIGH-GAIN PHOTODETECTORS MADE FROM NIPI MESAS WITH SELECTIVE LATERAL CONTACTS

[75] Inventors: Gottfried H. Doehler, Erlangen, Fed. Rep. of Germany; Caroline J. Scott, Atherton, Calif.; Gary R. Trott, San Mateo, Calif.; Betty Boatman, Palo alto, Calif.

[73] Assignee: Hewlett-Packard Company, Palo Alto, Calif.

[21] Appl. No.: 167,829

[22] Filed: Mar. 14, 1988

[51] Int. Cl.$^4$ .............................................. H01L 23/48
[52] U.S. Cl. ............................................ 357/71; 357/4; 357/67; 357/56
[58] Field of Search ...................... 357/4 SL, 4, 71, 67, 357/56

[56] References Cited

U.S. PATENT DOCUMENTS

| | | | |
|---|---|---|---|
| 4,257,055 | 3/1981 | Hess | 357/4 |
| 4,607,272 | 8/1986 | Osburn | 357/4 |
| 4,645,707 | 2/1987 | Davies | 357/4 |

Primary Examiner—Martin H. Edlow
Attorney, Agent, or Firm—John A. Frazzini

[57] ABSTRACT

A selective contact to a NIPI doping superlattice having a trap free (or low trap density) contact in contact with the layers of the superlattice. In a NIPI superlattice, the trap free region is a doped region that can be produced: by diffusion of dopant ions from a doped metal contact; by overdoping of the edges of the superlattice; or by overgrowth of the edges of the superlattice with a doped material that is trap free.

14 Claims, 3 Drawing Sheets

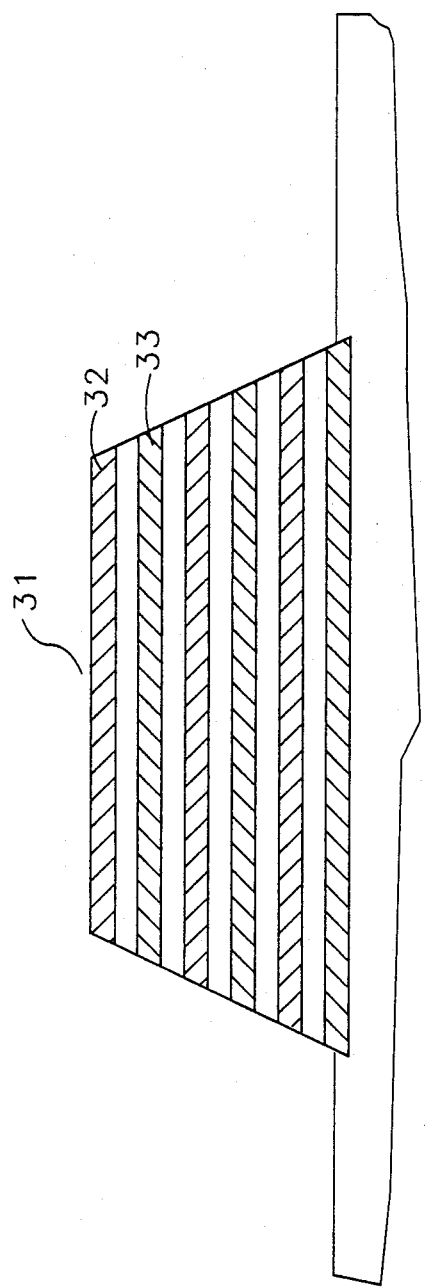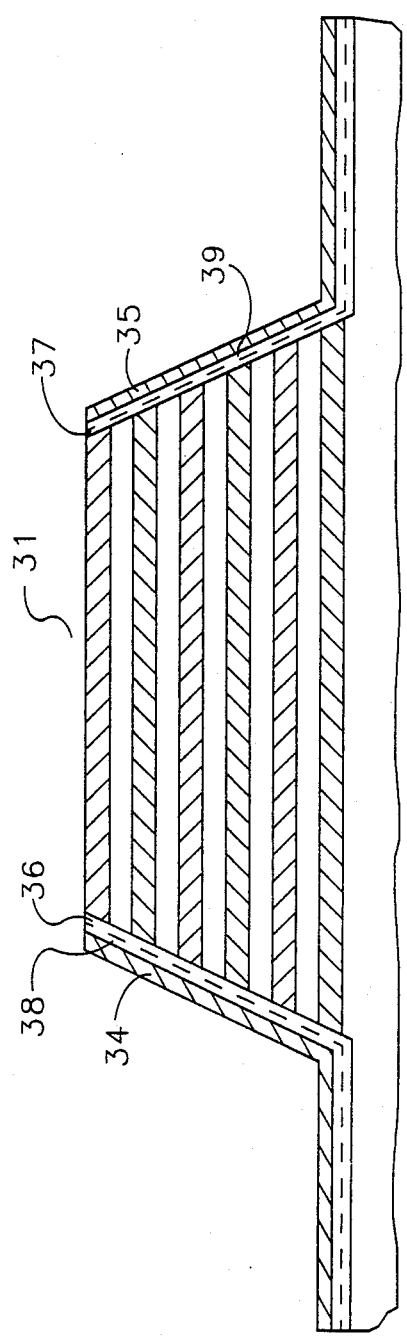

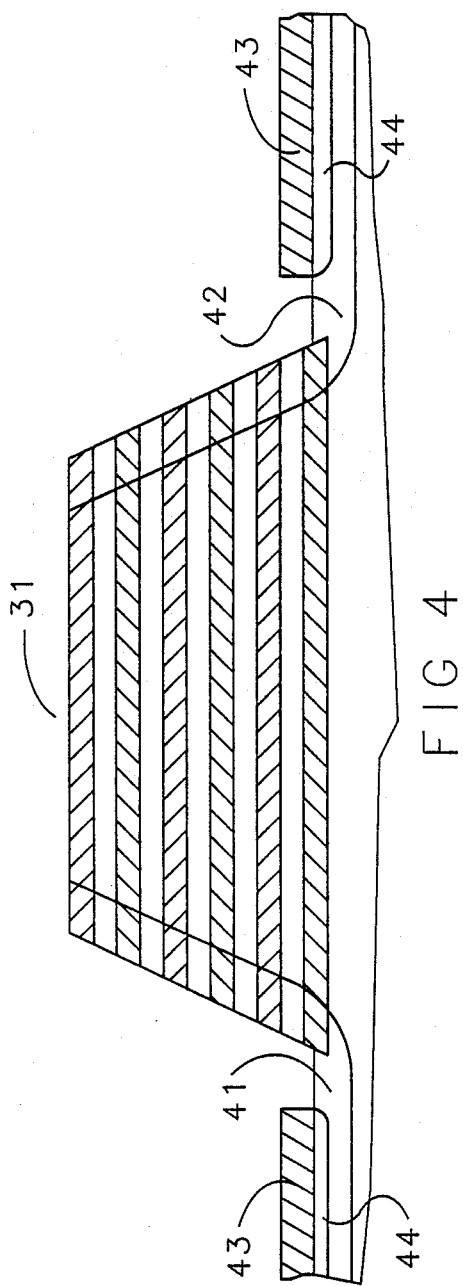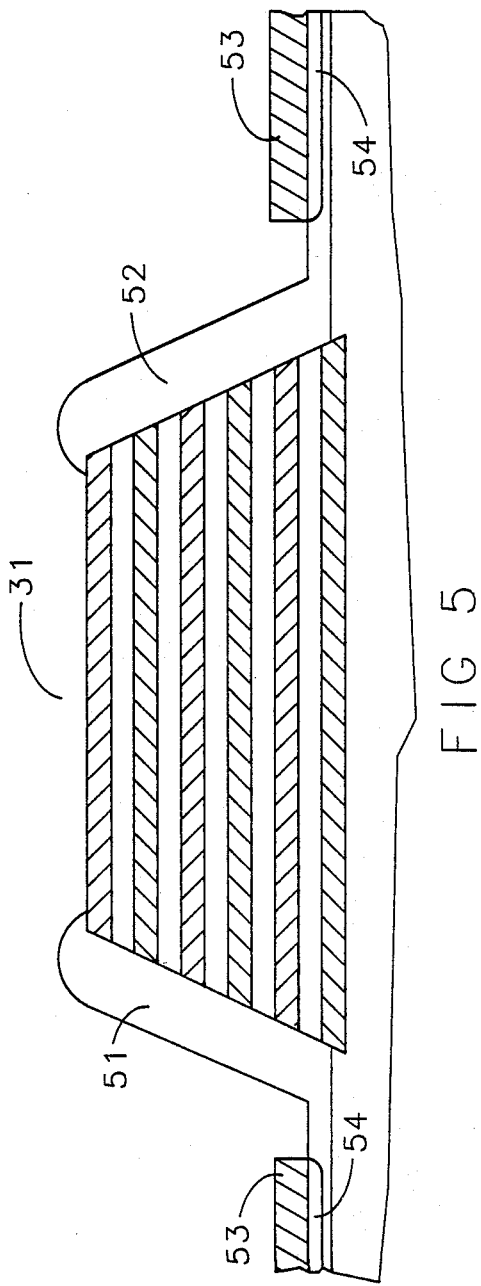

HIGH-GAIN PHOTODETECTORS MADE FROM NIPI MESAS WITH SELECTIVE LATERAL CONTACTS

BACKGROUND OF THE INVENTION

This invention relates in general to NIPI superlattices and relates more particularly to an improved type of selective contacts for a NIPI doping superlattice structure. The general theory of superlattices is presented in an article by Gottfried H. Doehler entitled SOLID-STATE SUPERLATTICES published in the November 1983 issue of Scientific American, pages 144–151. Superlattices are of interest because they have interesting electrical and optical properties, because their electrical and optical properties can be adjusted by the choice of parameters of the superlattice. Specifically, in NIPI doping superlattices, these properties can be tuned by application of electrical or electromagnetic fields.

There are two types of superlattices: a compositional superlattice (also called a heterostructure superlattice) and a doping superlattice. A compositional superlattice is a periodic array of ultrathin layers of two different semiconductors in alternation. Each layer is no more than a few hundred atoms thick so that there is significant interaction between adjacent layers. The composition of the two layers is selected so that they have a compatible lattice structure and so that the band gap in one of the layers is not equal to that in the other layer.

The effect of the superlattice structure is that the bottom of the conduction band exhibits a potential well for electrons in each of the smaller band gap layers and exhibits a potential barrier in each of the larger band gap layers. Likewise, the top of the valence band exhibits a periodic array of potential wells for holes. One such superlattice consists of an alternating sequence of layers of gallium arsenide (GaAs) and aluminum gallium arsenide (AlGaAs). These potential wells break the conduction band into a series of minibands and significantly affect the electrical and optical properties of the superlattice.

A doping superlattice consists of an alternating sequence of n and p doped layers in a semiconductor. These doped layers may, but need not, be separated by layers of undoped (intrinsic) semiconductor material. The doping superlattice is also referred to as a NIPI superlattice because of the alternating n-doped, intrinsic, p-doped and intrinsic layers in such a superlattice.

The recombination of electrons from the n-type layers with holes from the p-type layers results in a periodic charge variation in the superlattice that produces a periodic variation in the bottom of the conduction band and in the top of the valence band, thereby producing a periodic array of potential wells as in a compositional superlattice. This also results in a separation between the holes and the electrons so that the recombination time for excess holes and electrons is greatly increased. When excited optically or electrically, a large number of excess holes and electrons are created that flatten the periodic potential and increase the effective band gap (defined as the distance between a minimum in the bottom of the conduction band and a maximum in the top of the valence band) of the superlattice. Therefore, the electrical and optical properties can be varied by varying the number of excess holes and electrons in the superlattice.

In order to vary the number of excess holes and electrons by electrical excitation, a pair of selective contacts need to be produced. The first selective contact needs to make a low impedance ohmic contact to the n-doped layers, but not to the p-doped layers and the second selective contact needs to make a low impedance ohmic contact to the p-doped layers, but not to the n-doped layer.

At present, selective contacts to the n- and p-type layers are formed, respectively, by depositing small tin (Sn) and tin/zinc (Sn/Zn) balls on the surface of the superlattice and then annealing the superlattice to diffuse these dopants downward into the superlattice. The diffused tin and zinc atoms cause strong n-and p-doped regions below the surface of the superlattice, thereby producing the first and second selective contacts, respectively. Unfortunately, these selective contacts are far from ideal. The sizes of the balls are variable so that reproducible results are not achieved. The deposited balls are quite large on the scale of present integrated circuit features so that the resulting contacts are equally large making this process unsuited for miniaturization. The large surface area of these contacts results in a large parasitic capacitance and also, because of band gap states at the interface between these contacts and the superlattice, results in high leakage current and high recombination rate. Extremely low electroluminescence efficiency at room temperature results because of this undesirable nonradiative recombination at the selective contacts. Therefore, it would be advantageous to develop a method that enables the production of selective contacts that are not limited by these problems.

Unfortunately, it is difficult to make a selective contact that at the same time makes a good ohmic contact with one dopant type and a good high impedance contact with the other dopant type. This difficulty is illustrated by the Sn and Sn/Zn selective contacts discussed above which produce such a high recombination rate that electroluminescence efficiency is extremely low at room temperature. Except for this one example of *selective* contacts, work on contacts only considered the properties of *ohmic* contacts to one dopant type of material and had no concern with the properties of this contact to the opposite dopant type of material.

SUMMARY OF THE INVENTION

The difficulty of producing good selective contacts is illustrated in FIG. 1 in which is presented a energy band diagram for a typical ohmic contact between an n-doped metal conductor 16 and an n-doped semiconductor 17. At the interface 11 between the metal and the n-doped semiconductor, the energy $E_c$ of the bottom of the conduction band is equal to two-thirds of the energy gap $E_g$ of the n-doped semiconductor and the energy $E_v$ of the top of the valence band is equal to one-third of $E_g$. With increasing distance into the n-doped semiconductor, $E_c$ decreases to a value $E_{cn}$ and $E_v$ decreases to a value of $E_{vn}$. Because this is an n-type material, $E_{cn}$ is closer to the Fermi level than is $E_{vn}$.

This variation in $E_c$ is produced by a space charge in the transition region in which $E_c$ varies from $2E_g/3$ to $E_{cn}$. The depth D of this transition region decreases with increasing concentration of n-type dopant atoms in the n-doped semiconductor. This transition region acts as a potential barrier that inhibits the flow of electrons between the metal and the semiconductor and produces an exponential variation in current as a function of the an applied voltage difference between the metal and the semiconductor. With a sufficiently large dopant concentration, D becomes small enough that the electrons can more readily tunnel through this barrier than obtain sufficient kinetic energy to travel over this barrier. When such is the case, the exponential variation of current with applied voltage is replaced with a substantially linear voltage-current relationship. Thus, an ohmic contact is produced between the n-doped metal and the n-doped semiconductor. When this same n-doped metal is brought into contact with a p-doped semiconductor, a pn junction is produced.

Such an n-doped metal can be used to form the first type of selective contacts (i.e., contacts that make an ohmic contact with the n-doped layers and a high impedance contact with the p-doped layers in a NIPI superlattice). When this n-doped metal makes contact with a p-doped semiconductor, a pn junction is formed at the interface between the n-doped metal and the p-doped semiconductor. It is this pn junction that produces the high impedance desired between this contact and the p-doped layers in a NIPI superlattice.

Unfortunately, in ohmic contacts, there are also typically produced a large number of band gap trap states 12 that increase the leakage current and that act as recombination centers. These trap states do not interfere with the ohmic junctions to the n-doped layers, but they produce an unacceptable level of leakage current and recombination rate at the pn junctions formed with the p-doped layers of the superlattice.

In FIG. 2 is illustrated an improved selective contact of a first type that makes a low impedance ohmic contact to the n-doped layers 24 and makes a good pn contact with the p-doped layers 25 of the NIPI superlattice 23. The NIPI superlattice may, but need not include intrinsic layers 26. In these contacts, an n-doped semiconductor 22 extends from a metal layer 21 to the NIPI superlattice 23. The portion 27 of this n-doped semiconductor region 22 adjacent to the metal 21 can contain midgap trap states, but the portion 28 of this n-doped semiconductor 22 adjacent to the NIPI superlattice 23 is free of mid-gap trap states. As a result of this, the pn junctions 29 formed between this trap state free n-doped region 28 and the p-doped layers 25 of the NIPI superlattice are free of the recombination producing trap states so that a good high impedance pn junction is formed with each of the p-doped layers and a good low impedance ohmic contact is formed with each of the n-doped layers of the NIPI superlattice. Because the trap states are separated spatially from the pn junctions, these junctions have a low leakage current and a low recombination rate.

Similarly, the second type of selective contact (i.e., the selective contact that is to make ohmic contact to the p-doped layers) contains a p-doped semiconductor extending between a metal and the NIPI superlattice. The region of this p-doped semiconductor adjacent to the NIPI superlattice is free of midgap trap states so that good pn junctions are formed with the n-doped layers of the NIPI superlattice.

Three embodiments are presented. In each of these embodiments, a NIPI superlattice is etched to form a mesa structure (see FIG. 3A) that exposes the sides of the NIPI superlattice so that an edge of each of the layers of the NIPI superlattice is exposed. In the first embodiment (shown in FIG. 3B), an n-doped metal contact and a p-doped metal contact are formed in direct contact with the sidewall of the mesa so that each of these metal contacts is in direct contact with all of the layers of the NIPI superlattice. The dopant materials used in these metals are selected to diffuse into the NIPI superlattice, during an annealing step, faster than any components in the metal that could form mid-gap trap states. The dopant concentrations in the metals are also selected to be high enough that, in the region of the NIPI superlattice into which these dopants diffuse, they introduce an amount of dopant higher than the dopant level of the NIPI superlattice layers of the opposite dopant type. As a result of this, the region into which these dopants diffuse and into which the trap state forming components of the metal do not diffuse becomes a trap state free doped region of the same type as the dopant that is diffusing from the metal contact into the NIPI superlattice.

In the second embodiment (shown in FIG. 4), photolithographic masking techniques are used to dope a first region of the sidewall of the mesa with n-dopant and to dope a second region of the sidewall of the mesa with p-dopant. The dopant concentrations are chosen to be larger than in the NIPI superlattice so that these additional dopants override the NIPI doping. Metal contacts are then formed to these n- and p-doped regions.

In the third embodiment (shown in FIG. 5), photolithographic techniques are used to grow an n-doped pad and a p-doped pad in contact with the sidewall of the mesa Metal contacts are then formed to these n- and p-doped pads.

This type of selective contact has a number of advantages over the selective contacts discussed in the Background of the Invention. Unlike the previous contacts, this new type of selective contact can be manufactured with highly reproducible characteristics. The contacts can be formed by standard photolithographic techniques so that these new selective contacts can be miniaturized. Because of this ability to miniaturize these contacts, two contacts can be produced that are separated by a distance that can be much smaller than in the previous type of selective contacts. This enables the gain of NIPI photodetectors to be significantly increased for the following reason. The gain of photoconductive detectors, defined as the number of electrons in the photocurrent per electron-hole pair created by the photons, in principle can become very large in the case of photodetectors made from NIPI doping superlattices. Its value is given by the ratio of the recombination lifetime of the photogenerated carriers at the contacts and the transit time between the contacts. The small spacing possible between these new selective contacts enables the transit time to be significantly reduced, thereby significantly increasing the gain of the NIPI photodetector. In addition, the new selective contacts have a significantly lower recombination rate than the previous selective contacts, thereby increasing the recombination lifetime of the photo-generated carriers. This also increases the gain of these devices.

The mesa structure of these selective contacts is also advantageous for making discrete devices from wafers with complicated vertical microstructures. The mesa technique is particularly adapted for monolithic integration of several or many devices. The lateral nature of the contacts (i.e., that the contacts are formed to the sides of the mesa instead of to the top surface of the NIPI superlattice) makes them suitable for production of contact pads that are spatially separated from the device. Also, the lateral nature of the contacts makes optimum use of the device area because there is no loss of effective device area by contacts located on top of the superlattice. This reduces the dark currents in these devices and, therefore, improves the signal-to-noise ratio of photodetector NIPI superlattices.

These new selective contacts have much lower capacitances than in PIN photodiodes. This is an important advantage for high optical-receiver sensitivity at high signal frequencies.

DESCRIPTION OF THE FIGURES

FIGS. 3A and 3B illustrate the production of an embodiment of the lateral selective contacts utilizing evaporated doped metal contacts.

FIG. 4 shows an embodiment of the lateral selective contacts utilizing doped regions in addition to metal contact pads.

FIG. 5 shows an embodiment of the lateral selective contacts utilizing deposited doped epitaxial layers and metal contact pads.

DESCRIPTION OF THE PREFERRED EMBODIMENT

Figure 1:
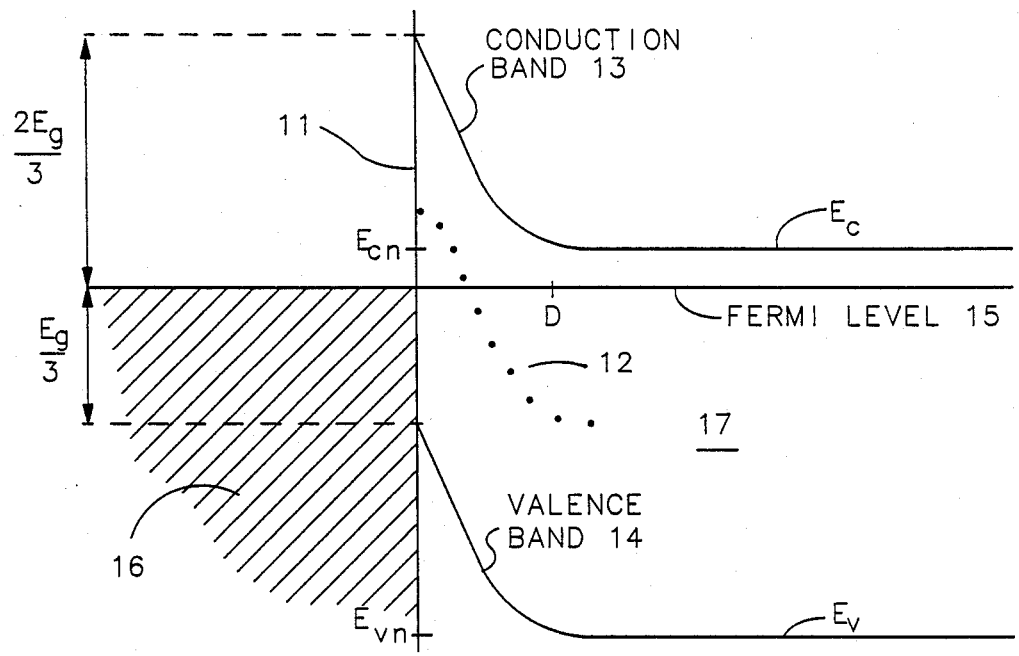
FIG. 1 presents a band diagram for an n-type ohmic contact to illustrate the presence and effect of mid-gap trap states in a typical ohmic contact.
Figure 2:
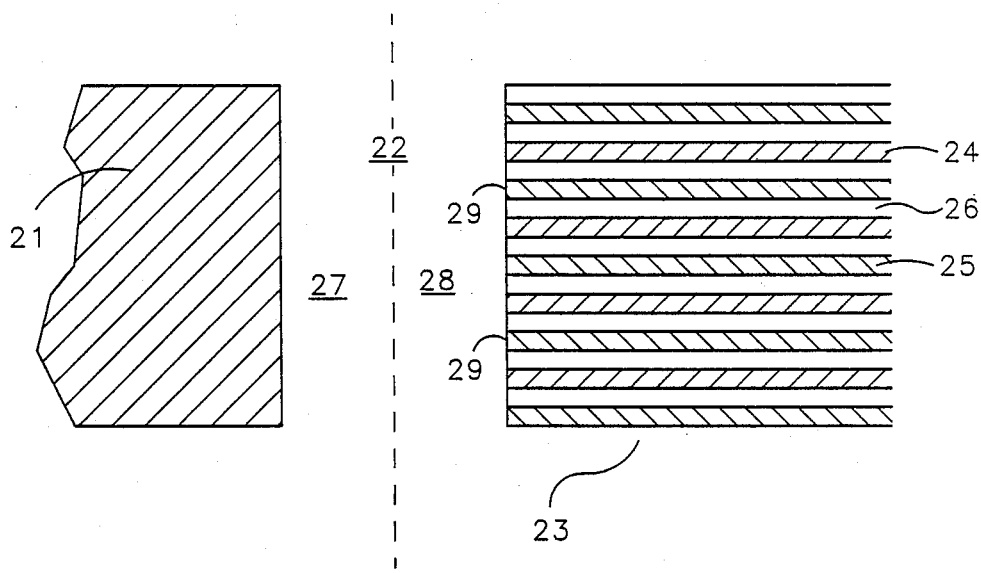
FIG. 2 illustrates the general structure of the improved selective contacts for the case of the first type of selective contacts (i.e., the selective contact that is to make ohmic contact to n-doped layers of the NIPI superlattice).

In FIGS. 3, 4 and 5 are shown 3 embodiments of an improved type of selective contacts. These contacts are formed by producing a NIPI superlattice 31 and then patterning this superlattice by standard photolithographic techniques to form a mesa that exposes at least a portion of the perimeter of each of the n-doped layers 32 and p-doped layers 33 of the NIPI superlattice. The improved selective contacts are then formed to the sides of the mesa.

FIGS. 3A and 3B illustrate the production of the first of these three embodiments. A NIPI superlattice 31 having n-doped layers 32 and p-doped layers 33 is etched to form a mesa as shown in FIG. 3A. A doped NIPI superlattice of GaAs is of particular interest because it can be made to interact strongly with visible light. A GaAs superlattice is a special case of III-V material superlattices. For such superlattices, the dopants are selected from columns II, IV and VI of the periodic table.

For a doped GaAs superlattice, the superlattice is typically grown on an undoped GaAs substrate with a (001)-oriented surface. A solution of sulfuric acid, hydrogen peroxide and water having the ratios $H_2SO_4$:$H_2O_2$:$H_2O = 1:1:4$ is used to etch the superlattice to form a mesa having sloping sidewalls. One pair of sidewalls oriented along the ($1\bar{1}0$) direction slope outward at an angle of 54.7 degrees from the horizontal and a second pair of sidewalls oriented along the (110) direction slope inward.

Photolithographic processing is used to produce an n-doped metal contact 34 in contact with a side of the mesa and a p-doped metal contact 35 in contact with a side of the mesa. For example, an n-doped layer can be deposited and then etched by photolithographic techniques to form contact 34, followed by similar formation of contact 35. Alternatively, contacts 34 and 35 can be formed by a photoresist lift-off technique. The liftoff technique is preferred when the metal contact is formed from more than one deposited layer because then a single lift-off step can be used to pattern each of these layers.

In one particular embodiment, n-doped contact 34 is formed by cleaning the surface of the superlattice (e.g., chemically, with an ion beam or with a plasma) depositing and patterning a photoresist to cover the superlattice everywhere that metal is to be removed, depositing 50 nm of nickel, depositing 450–550 nm of tin, and then dissolving the photoresist to remove metal overlaying the photoresist, thereby leaving metal contact 34. The p-doped contact is formed by depositing and patterning a photoresist, depositing 50–500 nm of gold, depositing 10–40 nm of zinc, depositing at least 100 nm of gold and then dissolving the photoresist to remove metal overlaying the photoresist, thereby leaving metal contact 35. In general, this doped contact should contain at least 0.5% Zn dopant. The wafer is then annealed for 30 seconds at 425 degrees Centigrade.

In the n-doped contact 34, the nickel serves as a wetting agent that keeps the tin from beading up on the surface of the superlattice. The tin serves as n-type dopant that diffuses into the superlattice during the annealing step to produce an n+ region that overcompensates the doping in the p-doped layers of the superlattice. In the p-doped contact 35, the gold serves as the wetting agent and the zinc serves as the p-type dopant that diffuses into the superlattice during the annealing step to produce a p+ region that overcompensates the doping in the n-doped layers of the superlattice.

The choices of the dopant metals and the wetting agents are important because the dopant metals must diffuse farther into the superlattice than the wetting agents diffuse so that trap state free doped regions 36 and 37 are formed in contact with the n- and p-doped layers 32 and 33 of the superlattice. This results in good pn junctions being formed between region 36 and p-doped layers 33 and good pn junctions being formed between region 37 and n-doped layers 32. Any trap states produced in the superlattice are restricted to regions 38 and 39 away from the pn junctions. Contact 34 makes ohmic contact with n-type layers 32 and contact 35 makes ohmic contact with p-type layers 33.

Nickel, gold and silver are standard wetting agents. However, it has been found that gold and silver are not suitable for use in the n-doped contact because they produce trap states in the resulting pn junctions. Nickel is a particularly good choice for the wetting agent not only because it diffuses more slowly than the tin, but also because it forms a metallic compound with tin at a relatively low annealing temperature of 420 degrees Centigrade.

In general, the thicknesses of the metal layers are selected by the following criteria. The wetting agent should be thick enough that it completely covers the surface where it is deposited. This requires that it be thicker than about 7 nanometers since, for thinner layers, the deposited metal will consist of disjoint islands of metal. Otherwise, it is advantageous to minimize the amount of wetting agent to minimize the amount of wetting agent that is available to diffuse into the superlattice and produce trap states.

On the other hand, the ratio between the amount of wetting and doping metals can be important in determining the physical properties of the contact. For example, as indicated above, the ratio of nickel to tin can be selected to produce a relative low annealing temperature. In general, the annealing temperature must be high enough to melt the metal contact so that the n-type dopant can diffuse into the superlattice. The melting point of the metal contacts cannot be too close to the typical device specification temperature of 120 degrees Centigrade or else the metal contacts can creep during device operation. On the other hand, the melting point should not be too close to diffusion temperatures (about 500 degrees Centigrade) in order to minimize the amount of diffusion of other dopants (e.g., the dopants in the n- and p-doped layers of the NIPI superlattice) during the annealing step. The composition of the metal contacts should also be selected so that the contacts are environmentally stable (e.g., so that they won't corrode in air or react with the device). In addition, the composition should be selected to produce an intermetallic compound when alloyed since this tends to lower the alloying temperature required and because this produces a more controlled composition. At other compositions, intermetallic compounds will be formed in globules within some other type of metal layer such as a eutectic compound.

The total thickness of each metal contact should be thick enough that it has sufficient structural strength that it is not damaged by other production steps such as wire bonding and probing. However, these contacts should not be so thick that the photoresist technique cannot be used or so thick that they could produce cracks in the superlattice. Also, in general it is advantageous to minimize thickness in order to minimize deposition time. The above choices of thicknesses for the nickel, tin, gold and zinc were made in view of these considerations. In general, the ranges of thicknesses for these atomic components are also 50–500 nm for the bottom layer of gold, 10–40 nm for zinc and at least 100 nm for the top layer of gold, but subject to the constraint that at least 0.5% of the contact is zinc.

Other choices of compounds for the n-doped metal contact are Te, Se, and Si. Similarly another choice of compound for the p-doped metal contact is Be.

A second embodiment of the selective contacts is presented in FIG. 4. In that embodiment, the mesa structure is produced as above and then conventional photolithographic steps are used to dope the superlattice in a region 41 with n-type dopants and in a region 42 with p-type dopants. For example, the superlattice mesa structure can be coated with a photoresist that is exposed and developed to expose the surface of the mesa adjacent to region 41. N-type dopants are then injected into this region, for example, by ion implantation or by diffusion. The photoresist is then removed and these steps are repeated to produce doped region 42. Metal contacts 43 are then formed in contact with regions 41 and 42. These can be produced by depositing a metal layer an then etching the unwanted metal or by a lift-off technique as used above. This embodiment has the advantage that there will be no deterioration of the quality of the selective contacts due to diffusion of the contact metals as can occur in the embodiment of FIG. 3A. Any trap states that are produced are surface states limited to a small region 44 adjacent to the metal contact. Also, this method is particularly suitable for very small contact dimensions.

A third embodiment is presented in FIG. 5. In that embodiment, photolithographic techniques are used to grow a n-doped overgrowth region 51 and a p-doped overgrowth region 52 on the mesa, each such region being in contact with all of the layers of the superlattice. Such regions can be produced, for example, by use of an oxide mask during growth of each region or by overgrowth of the entire wafer followed by selective etching away of the overgrowth material, except for the contact areas defined by a photoresist process. Metal contacts 53 are then formed in a manner as discussed above for the embodiment of FIG. 4. Any trap states that are produced are surface trap states that are restricted to a small region 54 adjacent to the metal contact.

We claim:

1. A selective contact to a NIPI superlattice having n-doped and p-doped layers, said contact comprising:
a first doped region that is substantially free of trap states and that is in contact with the n- and p-doped layers of the superlattice, said trap state free doped region forming an ohmic contact with a first one of the n- and p-doped layers and forming pn junctions with a second one of the n- and p-doped layers.

2. A selective contact as in claim 1 wherein said first doped region comprises a region of the NIPI superlattice that has been doped by vapor phase diffusion by an amount of dopant that overrides the amount of dopant in the layers of the superlattice, whereby this entire first doped region has a single dominant dopant type.

3. A selective contact as in claim 2 further comprising:
a second doped region containing trap states, said second doped region being in contact with the trap state free doped region, but making no contact with the portion of the superlattice outside of the first doped region; and
a metal contact in contact with the second doped region, but not in contact with that part of the NIPI superlattice that is outside of the first doped region.

4. A selective contact as in claim 1 wherein said first doped region comprises a region of the NIPI superlattice that has been doped by ion implantation by an amount of dopant that overrides the amount of dopant in the layers of the superlattice, whereby this entire first doped region has a single dominant dopant type.

5. A selective contact as in claim 4 further comprising:
a second doped region containing trap states, said second doped region being in contact with the trap state free doped region, but making no contact with the portion of the superlattice outside of the first doped region; and
a metal contact in contact with the second doped region, but not in contact with that part of the NIPI superlattice that is outside of the first doped region.

6. A selective contact as in claim 1 wherein said first doped region comprises an overgrown doped region in contact with the layers of the superlattice.

7. A selective contact as in claim 6 further comprising a second doped region containing trap states, said second doped region being in contact with the trap state free doped region, but making no contact with the superlattice.

8. A selective contact as in claim 1 further comprising:
a doped metal contact; and
a second doped region containing trap states, said second doped region being in contact with the trap state free doped region, but making no contact with the n- and p-doped layers of the superlattice; wherein said metal contact is in contact with the second doped region, said first doped region comprises a region of the NIPI superlattice that has been doped by diffusion of dopant from said doped metal contact by an amount of dopant that overrides the amount of dopant in the layers of the superlattice, whereby this entire first doped region has a single dominant dopant type.

9. A selective contact as in claim 8 wherein the superlattice is a doped GaAs superlattice and wherein the doped metal consists essentially of nickel and tin.

10. A selective contact as in claim 9 wherein said metal contact contains between 9 and 11 percent nickel by volume.

11. A selective contact as in claim 9 wherein the doped metal is between 50 and 60 nm thick.

12. A selective contact as in claim 8 wherein the superlattice is a doped GaAs superlattice and wherein the doped metal consists essentially of gold and zinc.

13. A selective contact as in claim 12 wherein said metal contact contains at least 0.5 molar percent zinc.

14. A selective contact as in claim 12 wherein the metal contact comprises:

a layer of gold between 50 and 500 nm thick;

a layer of zinc between 10 and 40 nm thick; and a layer of gold at least 100 nm thick.

* * * * *